United States Patent [19]
Bryant

[11] Patent Number: 5,668,028
[45] Date of Patent: Sep. 16, 1997

[54] METHOD OF DEPOSITING THIN NITRIDE LAYER ON GATE OXIDE DIELECTRIC

[75] Inventor: Frank Randolph Bryant, Denton, Tex.

[73] Assignee: SGS-Thomson Microelectronics, Inc., Carrollton, Tex.

[21] Appl. No.: 431,336

[22] Filed: Apr. 28, 1995

Related U.S. Application Data

[62] Division of Ser. No. 159,461, Nov. 30, 1993.

[51] Int. Cl.⁶ .................................................. H01L 21/265
[52] U.S. Cl. .................................................. 438/287; 438/308
[58] Field of Search .............................. 437/24, 42, 978

[56] References Cited

U.S. PATENT DOCUMENTS

| | | |
|---|---|---|
| 3,576,478 | 4/1971 | Watkins et al. . |
| 3,892,891 | 7/1975 | Goodman et al. . |
| 3,898,105 | 8/1975 | Mai et al. . |
| 3,899,363 | 8/1975 | Dennard et al. . |
| 3,909,304 | 9/1975 | Cho . |
| 3,913,126 | 10/1975 | Hooker et al. . |
| 3,913,211 | 10/1975 | Seeds et al. . |
| 3,943,542 | 3/1976 | Ho et al. . |
| 3,958,323 | 5/1976 | De La Moneda . |
| 3,966,501 | 6/1976 | Nomura et al. . |
| 3,996,658 | 12/1976 | Takei et al. . |
| 4,013,484 | 3/1977 | Boleky et al. . |
| 4,023,195 | 5/1977 | Richman . |
| 4,039,359 | 8/1977 | Nakamoto . |
| 4,045,249 | 8/1977 | Hotta . |
| 4,075,045 | 2/1978 | Rideout . |
| 4,092,661 | 5/1978 | Watrous, Jr. . |
| 4,112,575 | 9/1978 | Fu et al. . |
| 4,113,533 | 9/1978 | Okumura et al. . |
| 4,179,311 | 12/1979 | Athanas . |
| 4,329,773 | 5/1982 | Geipel, Jr. et al. . |
| 4,553,314 | 11/1985 | Chan et al. . |
| 5,100,820 | 3/1992 | Tsubone ........................ 437/44 |

FOREIGN PATENT DOCUMENTS

| | | |
|---|---|---|
| 48-60881 | 7/1973 | Japan . |
| 48-49382 | 7/1973 | Japan . |
| 48-71889 | 9/1973 | Japan . |
| 50-91288 | 7/1975 | Japan . |
| 51-118392 | 10/1975 | Japan . |
| 51-118393 | 10/1975 | Japan . |
| 52-47685 | 4/1977 | Japan . |
| 1421363 | 1/1976 | United Kingdom . |
| 1428713 | 3/1976 | United Kingdom . |

OTHER PUBLICATIONS

K. Nomura, et al., "Enhanced Oxidation of Silicon by Ion Implantation and its Novel Applications," 1974, pp. 681–688, no month provided.

*Primary Examiner*—John Niebling
*Assistant Examiner*—Richard A. Booth
*Attorney, Agent, or Firm*—Theodore E. Galanthay; Kenneth C. Hill; Lisa K. Jorgenson

[57] ABSTRACT

A gate structure in a transistor and method for fabricating the structure. A gate structure is formed on a substrate. The gate structure includes three layers: an oxide layer, a nitride layer and a polysilicon layer. The oxide layer is located on the substrate, the nitride layer is located on the oxide layer, and the polysilicon layer is located on the nitride layer. The gate structure is reoxidized to form a layer of oxide over the gate structure.

8 Claims, 5 Drawing Sheets

METHOD OF DEPOSITING THIN NITRIDE LAYER ON GATE OXIDE DIELECTRIC

This is a Division of application Ser. No. 08/159,461, filed Nov. 30, 1993.

BACKGROUND OF THE INVENTION

1. Field of the Invention

The present invention relates to integrated circuit devices and more specifically to field effect devices such as field effect transistors (FET) for use in integrated circuits.

2. Description of the Prior Art

In manufacturing transistors, re-oxidation has been used in 5 µm to 1.2 µm technologies to improve transistor lifetimes and gate oxide reliability due to higher fields occurring at the etched polysilicon transistor edges. For example, U.S. Pat. No. 4,553,314 teaches using re-oxidation to manufacture semiconductor devices. Typically, 3 µm and 5 µm technologies use re-oxidation thicknesses from about 1200 Å to about 2500 Å depending on the particular device. In 1.5 µm and 2 µm technologies, re-oxidation thicknesses from about 500 Å to about 1,000 Å are used.

In 0.8 µm technology, however, the re-oxidation process has been discontinued because the lifetimes of transistors currently manufactured without the re-oxidation process is better than with the re-oxidation process. Such a situation is caused by the formation of asperities on the underside of the polysilicon layer of the transistor during the re-oxidation process. These asperities are of little importance until the gate oxide thicknesses are reduced to below 200 Å as used in submicron technology. At this point, the asperities become a contributor to the increased field at the transistor edge and of hot carrier injection (HCI). These asperities are caused by (1) oxidant diffusion along polysilicon grain boundaries creating single crystal silicon protrusions and (2) oxide thicknesses under the polysilicon edge increasing during re-oxidation, causing polysilicon grain boundary slip to occur and creating multiple edges, which results in an overall increase in angle geometries.

In addition, moving to device geometries below 0.8 µm technology has resulted in marginal lifetimes of the transistors. Thus, it is desirable to have a gate structure that has an increased lifetime using re-oxidation under the gate edge but without the asperities caused by presently used re-oxidation processes.

SUMMARY OF THE INVENTION

The present invention is a gate structure in a transistor and method for fabricating the structure. A gate structure is formed on a substrate. The gate structure includes three layers: an oxide layer, a nitride layer and a polysilicon layer. The oxide layer is located on the substrate, the nitride layer is located on the oxide layer, and the polysilicon layer is located on the nitride layer. The gate structure is reoxidized to form a layer of oxide over the gate structure. The nitride layer prevents the formation of asperities on the underside of the polysilicon layer during reoxidation of the transistor.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

The present invention allows for the use of re-oxidation to improve transistor lifetimes by reducing fields in transistor technologies through elimination of previous limitations. According to the present invention, a structure is provided which uses the increased distance at the gate edge, but eliminates the asperities created during re-oxidation so that re-oxidation may be used for submicron technologies. The structure of the present invention prevents the effects of oxidation on the polysilicon gate by using a thin silicon nitride layer located between the polysilicon and the gate oxide in a transistor.

Figure 1:
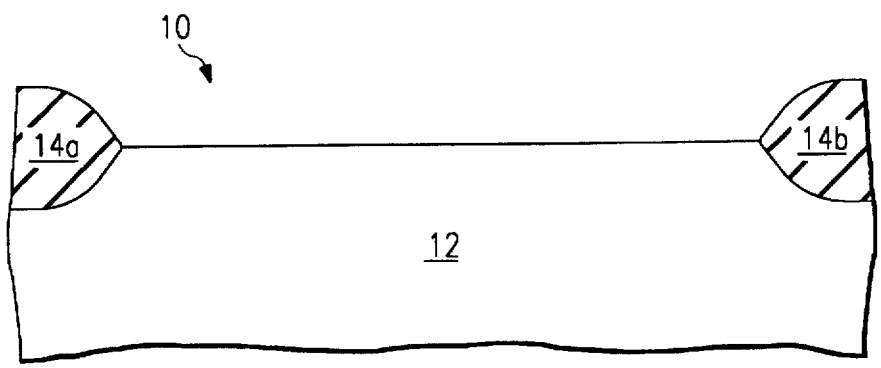
FIGS. 1–4 illustrate cross-sections of a portion of a semiconductor device during fabrication.

Referring now to FIG. 1, a schematic cross-section of a semiconductor device at an early stage in a manufacturing process is illustrated according to the present invention. Transistor 10 includes a substrate 12, which is typically a monocrystalline silicon of a conventional crystal orientation known in the art. Many features of the present invention are applicable to devices employing semiconductor materials other than silicon as will be appreciated by those of ordinary skill in the art. Substrate 12 may be either a p-type substrate or an n-type substrate. In the present illustrative example, a p-type substrate is employed. As can be seen with reference to FIG. 1, field oxides 14a and 14b have already been created in transistor 10.

Figure 2:
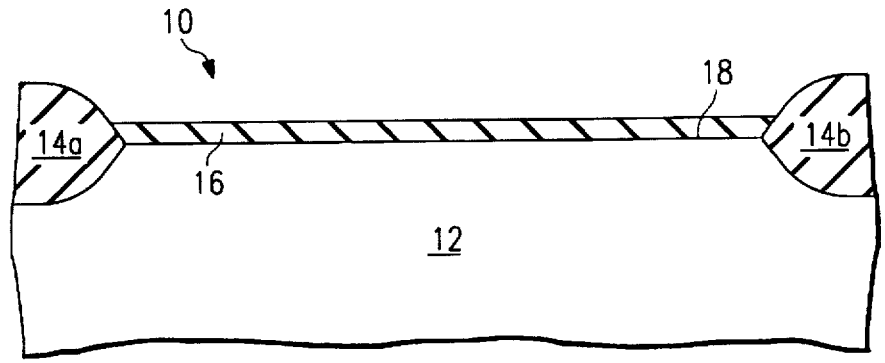

In FIG. 2, oxide layer 16, also called an insulating oxide layer or a gate oxide layer, is grown on surface 18 of substrate 12 in transistor 10. Thereafter, in FIG. 3, a silicon nitride layer 20 is deposited on top of oxide layer 16 and field oxide 14a and 14b. Silicon nitride layer 20 is deposited on transistor 10 in a layer that is preferably from about 10 Å to about 50 Å thick according to the present invention.

Figure 4:
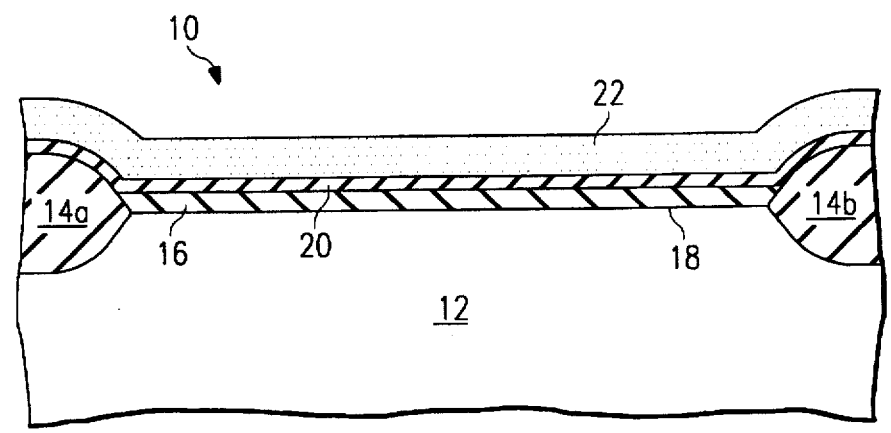
Figure 5:
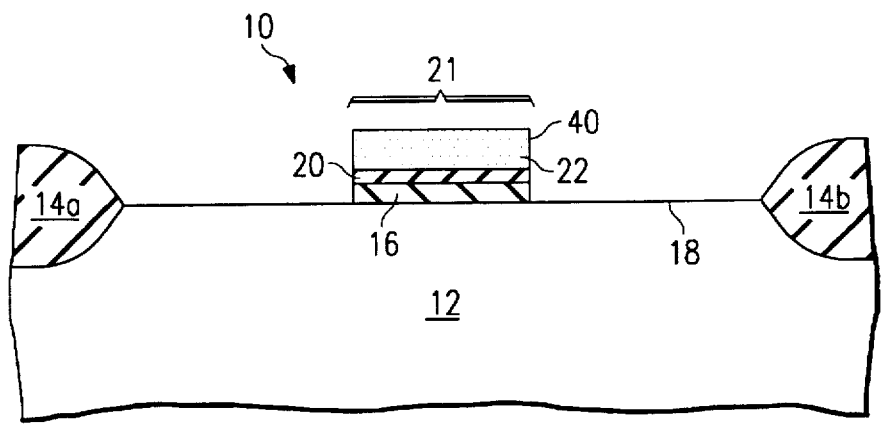
FIG. 5 illustrates a cross-section of a semiconductor device.
Figure 6:
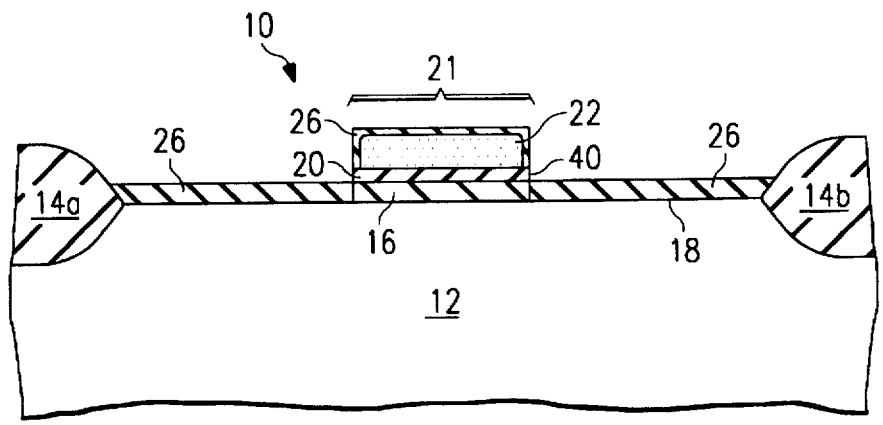
FIG. 6 illustrates a semiconductor device after reoxidation.

Thereafter, a polycrystalline silicon (polysilicon) layer 22 is deposited over silicon nitride layer 20 as illustrated in FIG. 4. Alternatively, a refractory metal, such as Mo, Ta, or W, or a metal silicide, such as $MoSi_2$, $TaSi_2$ or $WSi_2$, may be used. Transistor 10 is then patterned and etched to expose surface 18 in selected portions of transistor 10 as illustrated in FIG. 5 wherein a gate structure 21 for transistor 10 is formed. Next, re-oxidation is performed to produce oxide layer 26 covering the gate structure and the substrate, as illustrated in FIG. 6. Typically, in reoxidation, the exposed substrate and the gate structure are exposed to an oxidizing ambient. Such a process is well known to those skilled in the art. Also, oxide layer 26 produced by reoxidation is preferably from about 25 Å to about 500 Å thick on the p-type substrate.

Figure 7A:
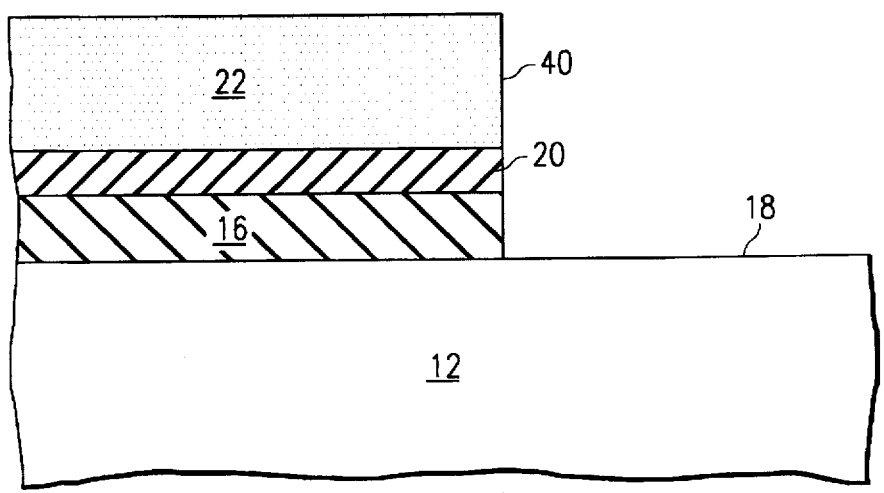
FIGS. 7A–7C depict an enlarged view of the cross-section shown in FIG. 5.
Figure 7B:
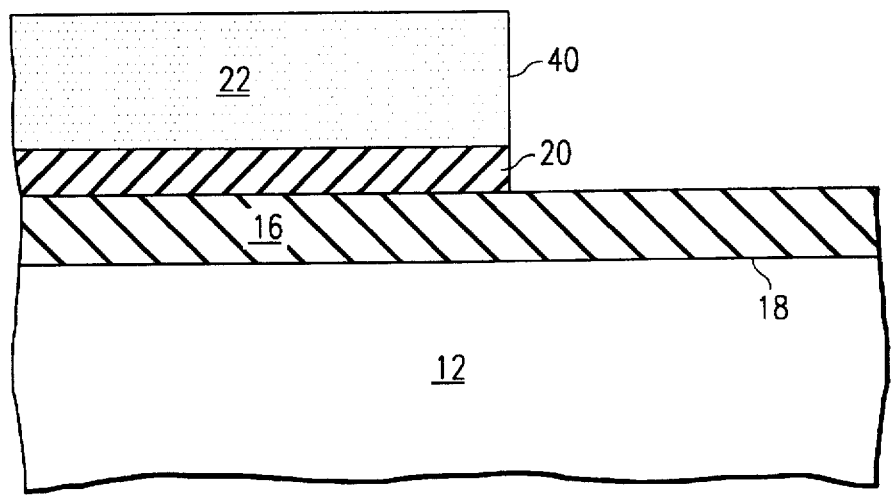
Figure 7C:
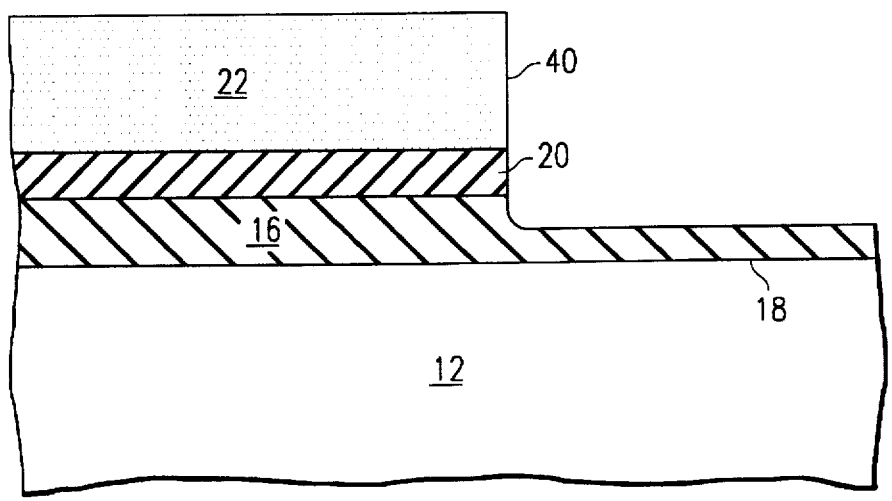

Referring now to FIG. 7, an enlarged view of a representative portion of FIG. 5 is depicted. The figure shows in greater detail a portion of gate 21. As can be seen, polysilicon layer 22, nitride layer 20, and oxide layer 16 have been etched away to expose surface 18 of substrate 12. Alternatively, oxide layer 16 may be left in its entirety as illustrated in FIG. 7B, or partially etched away as illustrated in FIG. 7C.

Figure 8:
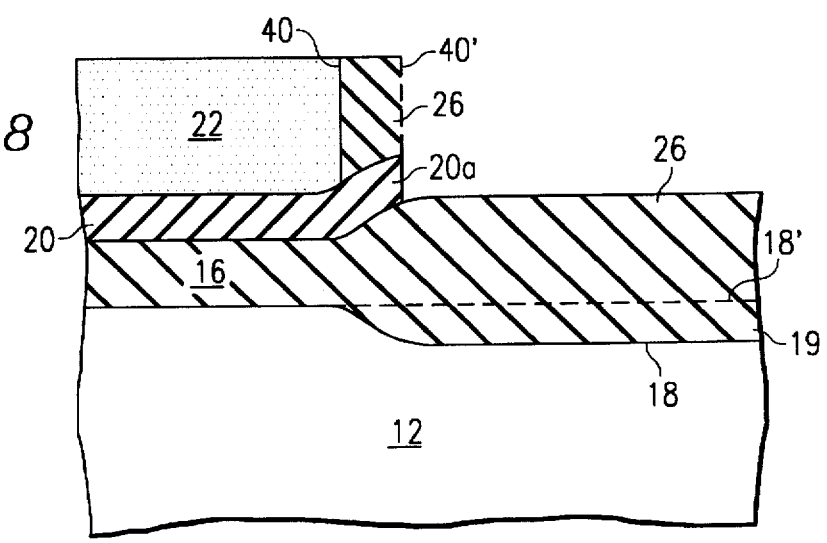
FIG. 8 illustrates an enlarged view of a cross-section from FIG. 6.

Now referring to FIG. 8, an enlarged view of transistor 10 from FIG. 6 is depicted. This enlarged view shows oxide layer 26 as grown during reoxidation of transistor 10. The reoxidation process which results in the growth of oxide layer 26 has the effect of moving peripheral edge 40 of polysilicon layer 22 in gate structure 21, as illustrated in FIG. 8. The position of the peripheral edge of gate structure 21 in polysilicon layer 22 is indicated by the dashed line 40'. In addition, the growth of oxide layer 26 moves surface 18 downward from its original position 18' to form an indentation 19 (the section of oxide from original position 18' to surface 18) in surface 18 of substrate 12 near the peripheral edge of gate structure 21. Also, nitride layer 20 has an uplift 20a caused by reoxidation of the transistor.

The reoxidation process is well known to those skilled in the art. Various temperatures and times may be may be used depending on the oxidizing ambient employed. For example, the transistor may be exposed to an oxidizing ambient such as dilute steam at a temperature from about 650° C. to about 900° C. from about 10 minutes to about 60 minutes.

Nitride layer 20 acts as a protective layer and prevents the formation of asperities in polysilicon layer 22 in gate structure 21 during reoxidation. Nitride layer 20 prevents oxidation of the bottom side of the polysilicon layer 22 and prevents formation of geometries which result in increased electric fields. In addition, the nitride layer will prevent outdiffusion of polysilicon dopants into the gate oxide, which if excessive can lead to early gate break downs. Such a feature is important especially when polysilicon dopants such as boron are used in large amounts. Moreover the higher density silicon nitride increases resistance of the gate oxide to physical damage during post gate oxide and polysilicon deposition silicidations.

Although the process depicted in FIGS. 1–4 deposits silicon nitride onto the gate oxide layer, other processes may be employed to create a silicon nitride layer between gate oxide layer 16 and the polysilicon layer 22. For example, a nitrogen ($N_2$) implant into the polysilicon followed by annealing the device forms a thin silicon nitride layer at the polysilicon oxide interface. More information on forming thin silicon nitride layers may be found in an article by Josquih et al., "The Oxidation Inhibition in Nitrogen Implanted Silicon", J. Electrochem. Soc: SOLID-STATE SCIENCE AND TECHNOLOGY (August 1982) pp. 1803–1811 and in U.S. Pat. No. 5,250,456.

Figure 9:
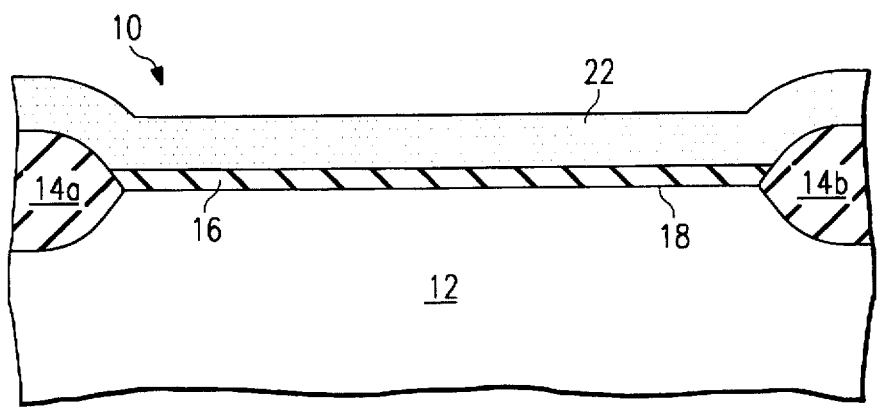
FIGS. 9–10 illustrate cross-sections of a portion of a semiconductor device during an implantation process.
Figure 10:
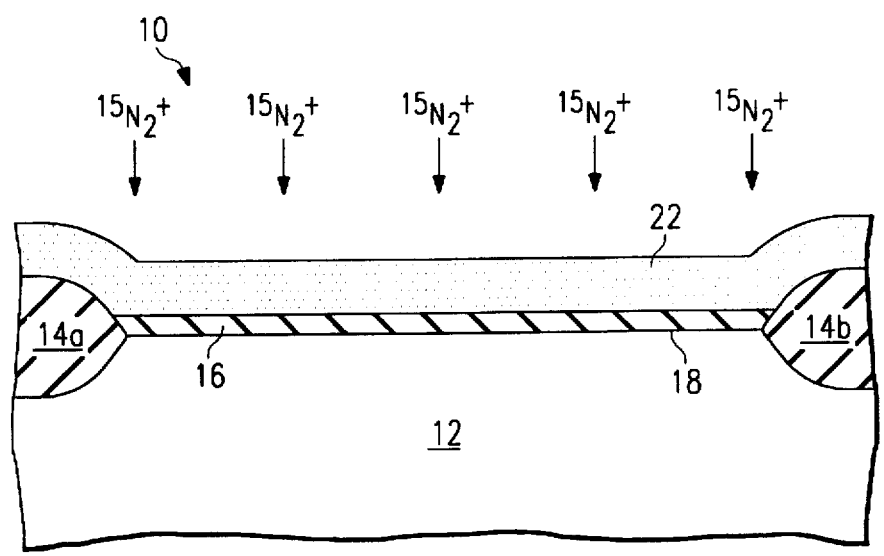

When nitrogen implantation is used to form a silicon nitride layer, polysilicon layer 22 is deposited over oxide layer 16 as illustrated in FIG. 9. Thereafter, nitrogen ions are implanted into transistor 10 as illustrated in FIG. 10. In accordance with a preferred embodiment of the present invention, $^{15}N_2+$ at a dose in the range of about 1E14 to 1E16 ions/cm$^2$. Thereafter, transistor 10 is annealed at a temperature from about 800° C. to about 1100° C. inert ambient gas, such as argon or helium, for about 15 minutes to 60 minutes. As a result, a nitride layer 20 as illustrated in FIG. 4 results from the annealing process. Nitride layer 20 is formed in a layer from about 15 Å to about 20 Å thick. Alternatively, transistor 10 may be annealed using rapid thermal processing in an inert ambient gas at about 900° C. to about 1200° C. for a period of time from about 5 seconds to about 3 minutes.

The anneal of the nitrogen-implanted polysilicon overlying oxide layer 16 causes the implanted nitrogen to accumulate at the polysilicon/oxide interface, forming a nitride layer. Thereafter, transistor 10 is patterned and etched as illustrated in FIG. 5 and re-oxidized as shown in FIG. 6.

Figure 3:
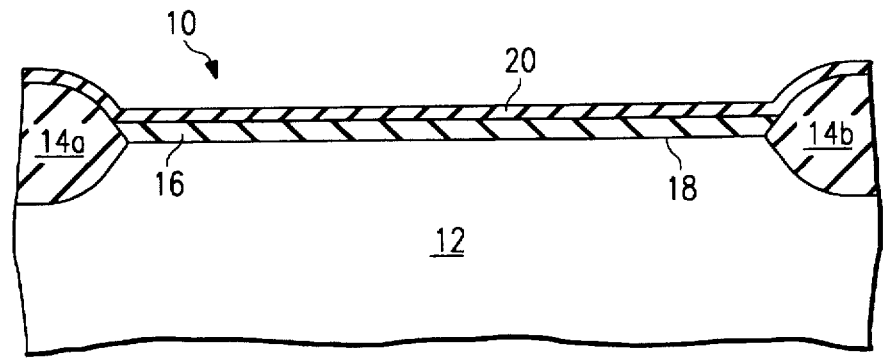

Alternatively, silicon nitride layer 20 may be formed on top of oxide layer 16, as illustrated in FIG. 3, using a rapid thermal anneal process. For example, $N_2$ or $NH_3$ may be employed in a rapid thermal anneal process at a temperature from about 700° C. to about 1200° C. for a period of time from about 10 seconds to about 300 seconds to form a silicon nitride layer.

Figure 11:
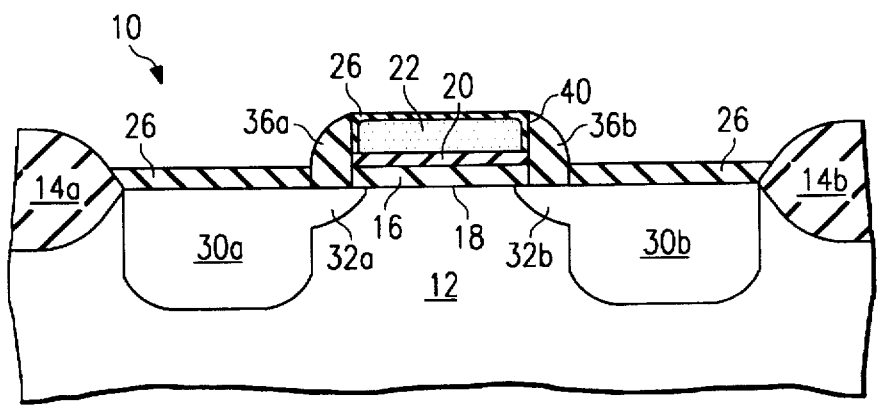
FIG. 11 depicts a cross-section of a semiconductor device after reoxidation and implantation of the source and drain regions.

Implantation to produce source and drains for transistor 10 may performed after the re-oxidation procedure as illustrated in FIG. 11. For example, n-type impurities may be implanted into a p-type substrate. The source/drain regions 30a and 30b are n-type active regions. Lightly doped drain (LDD) regions 32a and 32b are defined using sidewall oxide spacers 36a and 36b as known by those skilled in the art. The processing employed to produce the additional structures described in FIG. 10 after reoxidation are well known to those skilled in the art. Alternatively, LDDs 32a and 32b and sidewall spacers 36a and 36b may be omitted according to the present invention.

Figure 12:
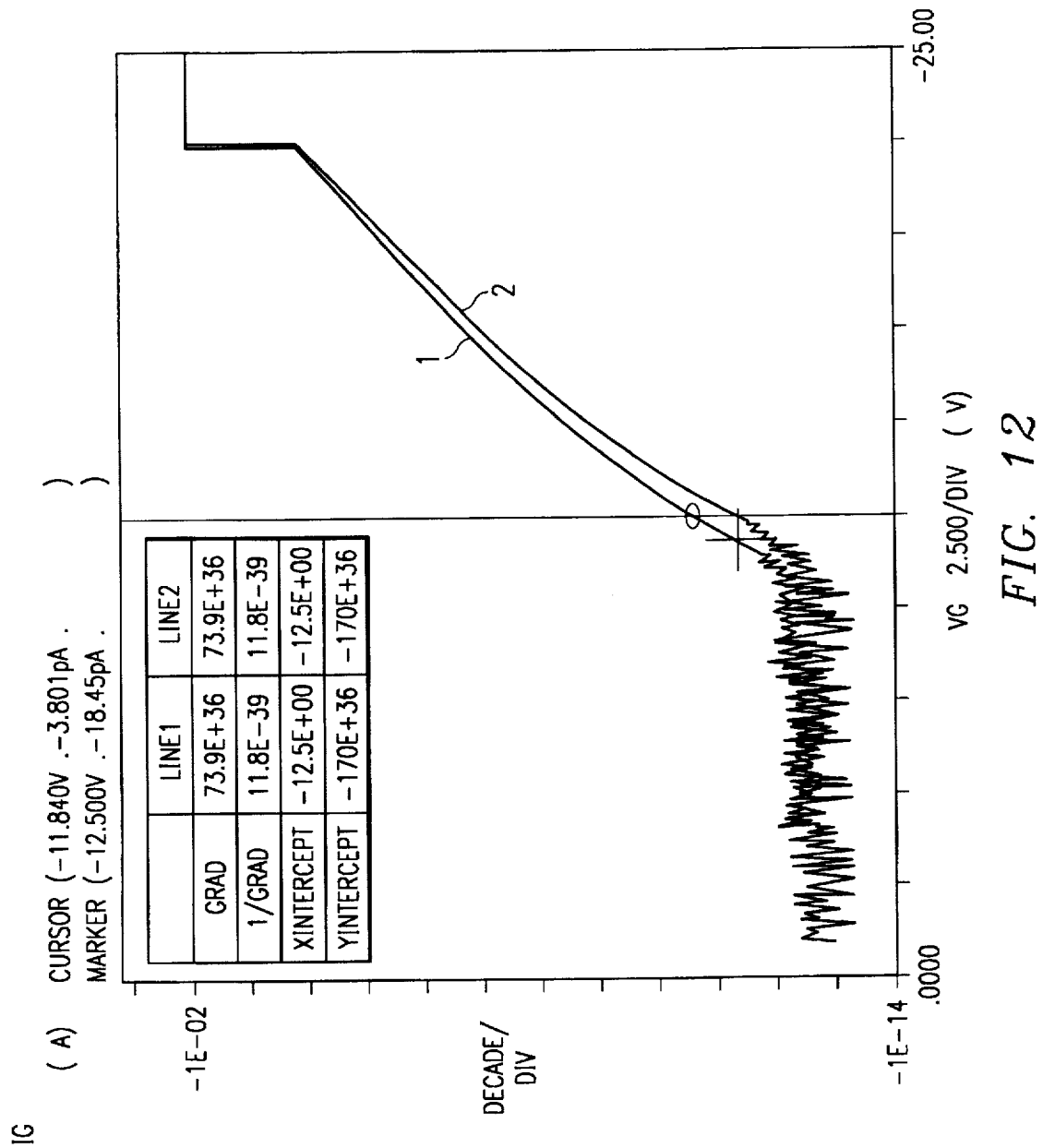
FIG. 12 is a graph of current injection for two semiconductor devices.

Referring now to FIG. 12, a graph of current injection for two semiconductor devices is depicted. The graph is of injection current, IG, for different voltages. IG currents for a first semiconductor without a nitride layer located between the polysilicon gate and the gate oxide is represented by line 1. IG currents for a second semiconductor device including a nitride layer between the polysilicon and gate oxide is represented by line 2. As can be seen from the graph in FIG. 12, the early rise currents are reduced in line 2. The two semiconductor devices are both n-channel transistors with oxide spacers. The two devices have a 0.7 μm wide gate finger structure and area of about $2e^4$ μm$^2$. Both devices under went reoxidation using 15 $O_2$ at 800° C. The second device has a nitride layer that is 10 Å. Otherwise the first and second devices are substantially identical. The nitride layer in the second semiconductor device represented in line 2 was created by silicon nitride deposition using a 30 minute deposition time at 750° C. The second semiconductor device was exposed to dichlorosilane ($SiCl_2H_2$) and ammonia ($NH_3$) in a ratio of 1 part dichlorosilane to 10 parts ammonia.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a portion of a semiconductor device comprising:

forming a gate oxide layer on and in contact with a surface of a substrate, wherein the gate oxide layer is less than 200 Å thick;

forming a nitride layer on the oxide gate layer;

forming a polysilicon layer on the nitride layer;

etching away the polysilicon and nitride layers in areas to form a gate structure; and reoxidizing the gate structure to form a layer of oxide, wherein a formation of asperities on an underside of the polysilicon layer is prevented.

2. The method of claim 1, wherein the step of forming a nitride layer comprises depositing a nitride layer on the gate oxide layer.

3. The method of claim 1, wherein the step of forming a nitride layer includes depositing the nitride layer on the gate oxide layer to a thickness from about 10 Å to about 50 Å.

4. The method of claim 1, wherein the step of etching exposes the surface of the substrate; and wherein the step of reoxidizing the gate structure comprises exposing the substrate to an oxidizing ambient to oxidize the exposed substrate surface.

5. The method of claim 4, wherein the exposing step includes exposing the substrate to the oxidizing ambient at a temperature from about 650° C. to about 900° C.

6. The method of claim 5, wherein the exposing step further includes exposing the substrate to the oxidizing ambient for about 10 minutes to abut 60 minutes.

7. The method of claim 1, wherein prior to the reoxidizing step, forming source and drain regions in the substrate.

8. The method of claim 1, further comprising forming source and drain regions in the substrate after the reoxidizing step.

* * * * *